United States Patent [19]
Fulcomer et al.

[11] Patent Number: 5,677,914
[45] Date of Patent: Oct. 14, 1997

[54] TEST VECTRO FEED-THRU

[75] Inventors: James L. Fulcomer, Manhattan Beach; Eduardo R. Zayas, La Palma, both of Calif.

[73] Assignee: Hughes Electronics, Los Angeles, Calif.

[21] Appl. No.: 637,885

[22] Filed: Apr. 25, 1996

[51] Int. Cl.⁶ .................................................. G01R 31/28
[52] U.S. Cl. .......................... 371/22.1; 371/22.5
[58] Field of Search ............................. 371/22.1, 22.2, 371/22.3, 22.5; 307/465, 473, 475; 327/565, 408, 334, 315; 326/158 R, 73.1; 395/183.19, 183.06; 364/481

[56] References Cited

U.S. PATENT DOCUMENTS

| | | | |
|---|---|---|---|
| 4,987,319 | 1/1991 | Kawana | 307/465 |
| 5,202,625 | 4/1993 | Farwell | 324/158 R |
| 5,457,381 | 10/1995 | Farwell | 324/158.1 |
| 5,509,128 | 4/1996 | Chan | 395/311 |
| 5,513,186 | 4/1996 | Levitt | 371/22.3 |
| 5,519,355 | 5/1996 | Nguyen | 327/565 |

Primary Examiner—Robert W. Beausoliel, Jr.
Assistant Examiner—Nadeem Iqbal
Attorney, Agent, or Firm—Leonard A. Alkov; Wanda K. Denson-Low

[57] ABSTRACT

A feed through circuit for an integrated circuit, including a first I/O pad (39); an input buffer (37) having an input connected to the first I/O pad and having an output; a second I/O pad (19); and an output buffer (15) having an input that is connected to the output of the input buffer and not connected to core logic circuitry of the integrated circuit, and further having an output that is connected to the second I/O pad; whereby a signal on the first I/O pad is fed through to the second I/O pad. Also disclosed is a feed through circuit that includes a first I/O pad (29); an input buffer (27) having an input that is connected to the first I/O pad and an output that is not connected to core logic circuitry of the integrated circuit; a multiplexer (21) having first and second inputs and an output, the first input being connected to the core logic circuitry and the second input being connected to the output of the input buffer; a second I/O pad (39); and an output buffer (35) having an input connected to the output of the multiplexer and an output connected to the first I/O pad; whereby a signal on the first I/O pad is fed through to the second I/O pad.

2 Claims, 1 Drawing Sheet

TEST VECTRO FEED-THRU

BACKGROUND OF THE INVENTION

The subject invention is generally directed to digital integrated circuits, and more particularly to a digital integrated circuit that enables test access to selected inputs and outputs of another digital integrated circuit that is included with the digital integrated circuit in a multi-chip module that does not include inputs and outputs that are directly connected to such selected inputs and outputs of the another digital integrated circuit.

Multi-chip modules (MCMs) are basically circuit boards that support and interconnect a plurality of digital integrated circuits. Some of the inputs and outputs of the digital integrated circuits of an MCM are connected inputs and outputs of the MCM, while other inputs and outputs of the digital integrated circuits are interconnected only on the MCM and are not directly connected to inputs and outputs of the MCM.

A consideration with MCMs is the lack of access by the MCM inputs and outputs to some or all of the inputs and/or outputs of an integrated circuit contained in the MCM, which prevents the testing of such integrated circuit via the inaccessible inputs and/or outputs of the integrated circuit. The number of inputs and outputs of an MCM could be increased to provide greater access to the inputs and outputs of the integrated circuits contained therein, but that would result in increased complexity, size, and cost.

SUMMARY OF THE INVENTION

It would therefore be an advantage to provide a digital integrated circuit that allows for electrical connection of an input or output of another digital integrated circuit to an input or output of a multi-chip module that contains the integrated circuits without increasing the number of inputs and outputs of the multi-chip module.

Another advantage would be to provide a digital integrated circuit that allows for testing of an input or an output of another digital integrated circuit that is not directly connected to an I/O pad of a multi-chip module that contains the integrated circuits.

The foregoing and other advantages are provided by the invention in a feed through circuit for an integrated circuit having core logic circuitry. One feed through circuit in accordance with the invention includes a first I/O pad (39); an input buffer (37) having an input connected to the first I/O pad and having an output; a second I/O pad (19); and an output buffer (15) having an input that is connected to the output of the input buffer and not connected to core logic circuitry of the integrated circuit, and further having an output that is connected to the second I/O pad; whereby a signal on the first I/O pad is fed through to the second I/O pad. A further feed through circuit in accordance with the invention includes a first I/O pad (29); an input buffer (27) having an input that is connected to the first I/O pad and an output that is not connected to core logic circuitry of the integrated circuit; a multiplexer (21) having first and second inputs and an output, the first input being connected to the core logic circuitry and the second input being connected to the output of the input buffer; a second I/O pad (39); and an output buffer (35) having an input connected to the output of the multiplexer and an output connected to the first I/O pad; whereby a signal on the first I/O pad is fed through to the second I/O pad.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
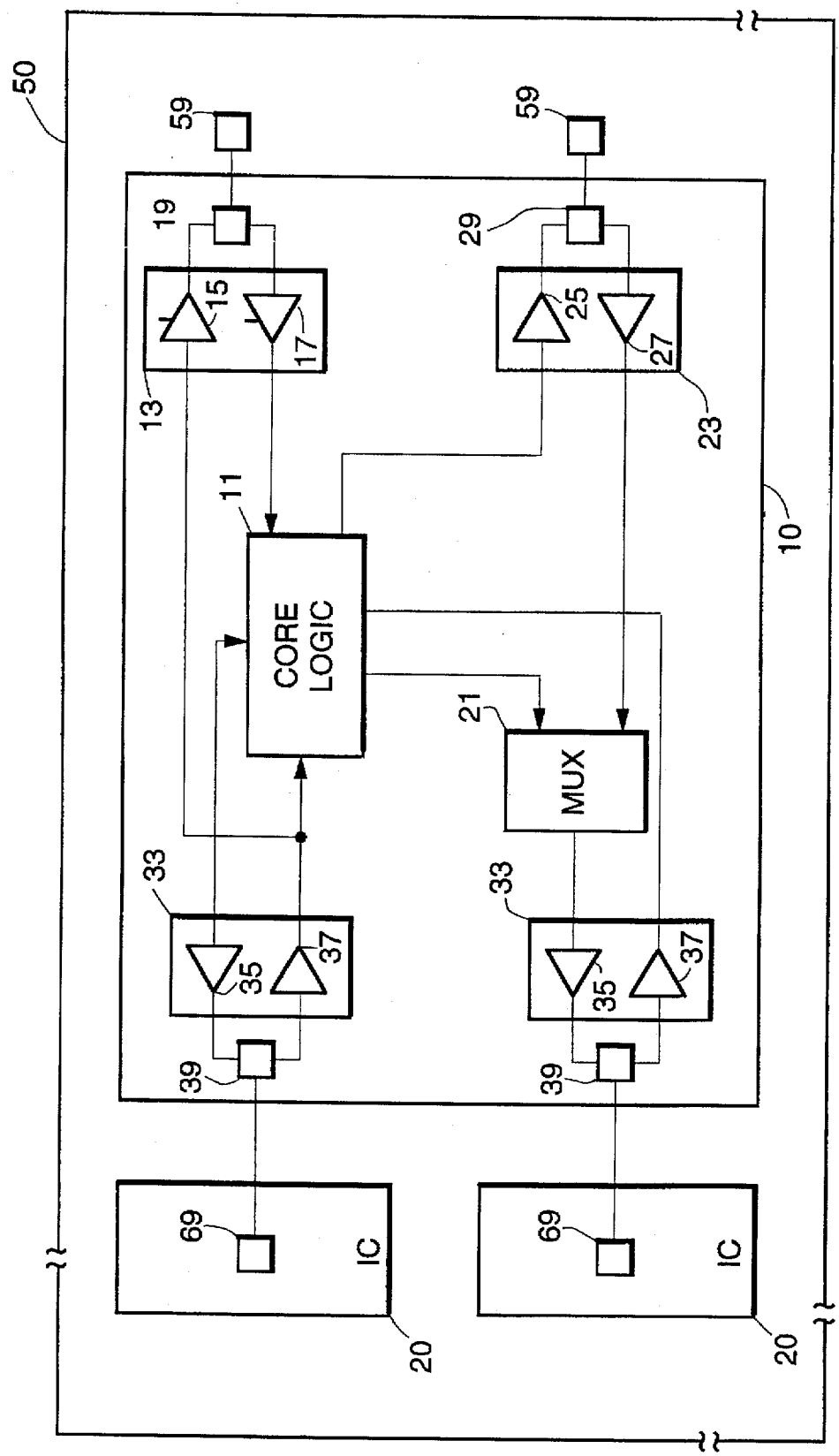
FIG. 1 is a schematic block diagram of a feed-through circuit in accordance with the invention.

In the following detailed description and in the several figures of the drawing, like elements are identified with like reference numerals.

Referring now to FIG. 1, set forth therein is a schematic block diagram of a feed-through circuit in accordance with the invention which is implemented in a digital integrated circuit 10 that includes core logic circuitry 11 and an input/output (I/O) cell 13 that provides an input only function relative to the core logic circuitry 11. The I/O cell 13 includes a three-state output buffer 15 and an input buffer 17. The output of the three-state output buffer and the input of the input buffer 17 of the I/O cell 13 are connected to an associated input/output (I/O) pad 19. The output of input buffer 17 is connected to the core logic circuitry 11, while the input of the output buffer 15 is not connected to the core logic circuitry 11. Hence, the I/O cell provides an input only function relative to the core logic circuitry 11. The I/O pad 19 is directly connected to an I/O pad 59 of a multi-chip module 50 which contains the integrated circuit 10.

The integrated circuit 10 further includes an input/output (I/O) cell 23 that provides an output only function relative to the core logic circuitry 11. The I/O cell 23 includes a three-state output buffer 25 and an input buffer 27. The output of the three-state output buffer 25 and the input of the input buffer 27 of the I/O cell 23 are connected to an associated input/output (I/O) pad 29. The input of the output buffer 25 is connected to the core logic circuitry 11, while the output of the input buffer 27 is not connected to the core logic circuitry 11. Hence, the I/O cell 23 provides an output only function relative to the core logic circuitry 11. The I/O pad 29 is directly connected to an I/O pads 59 of a multi-chip module 50 which contains the integrated circuit 10.

The integrated circuit 10 also includes a plurality of input/output (I/O) cells 33 which are connected to I/O pads 39 that are connected to I/O pads 69 of other digital integrated circuits 20, where such I/O pads 39 and 69 are not directly connected to I/O pads of the MCM 50. In particular, each of the I/O cells 33 includes a three-state output buffer 35 and an input buffer 37. The output of the three-state output buffer 35 and the input of the input buffer 37 of each I/O cell 33 are connected to an associated input/output (I/O) pad 39. Either or both the three-state buffer 35 and the input buffer 37 are connected to the core logic circuitry 11.

In accordance with the invention, the input of the output buffer 15 of an I/O cell 13 that provides an input only function relative to the core logic 11 is connected to the output of the input buffer 37 of an I/O cell 33. Further in accordance with the invention, the output of the input buffer 27 of an I/O cell 23 that provides an output only function relative to the core logic circuitry 11 is connected to an input of a 2-to-1 multiplexer 21 whose output is connected to the input of an output buffer 35 of an I/O cell 33. The other input of the 2-to-1 multiplexer 21 is connected to the core logic circuitry 11.

Thus, an output feed-through path is provided between an I/O pad 69 that is not directly connected to an MCM I/O pad 59 and an I/O pad 19 that is connected to an MCM I/O pad 59. In particular, such output feed-through path is provided by (a) the input buffer 37 of an I/O cell 33 which has an I/O pad 39 that is not directly connected to an MCM I/O pad 59, and (b) the output buffer of an I/O cell 13 that provides an input only function relative to the core logic 11 and which has an I/O pad 19 that is connected to an MCM I/O pad. In this manner, an output of an integrated circuit 20 that is not directly connected to an MCM I/O pad 59 can be accessed or sampled at an MCM I/O pad 59.

Further, an input feed-through path is provided between an I/O pad 29 that is directly connected to an MCM I/O pad 59 and an I/O pad 69 that is not directly connected to an MCM I/O pad 59. In particular, such input feed-through path is provided by (a) the input buffer 27 of an I/O cell 23 that provides an output only function relative to the core logic circuitry 11 and which has an I/O pad 29 that is directly connected to an MCM I/O pad 59, (b) the multiplexer 21, and (c) the output buffer 35 of an I/O cell 33 which has an I/O pad 39 that is not directly connected to an MCM I/O pad 59. In this manner, an input of an integrated circuit 30 which is not directly connected to an MCM I/O pad 59 can be accessed or stimulated at an MCM I/O pad 59.

From the foregoing it should be appreciated that invention contemplates utilizing input only and output only cells to route signals from and to I/O pads that are not directly connected to MCM I/O pads. It should also be appreciated that the invention would typically be implemented with more I/O cells that shown in the schematic of FIG. 1.

The foregoing has thus been a disclosure of a digital integrated circuit that advantageously allows for electrical connection of an input or output of another digital integrated circuit to an input or output of a multi-chip module that contains the integrated circuits without increasing the number of inputs and outputs of the multi-chip module.

Although the foregoing has been a description and illustration of specific embodiments of the invention, various modifications and changes thereto can be made by persons skilled in the art without departing from the scope and spirit of the invention as defined by the following claims.

What is claimed is:

1. A feed-through circuit for an integrated circuit having core logic circuitry, comprising:

a first I/O pad;

a first input buffer having an input connected to said first I/O pad and having an output;

a second I/O pad; and an I/O cell for providing an input-only function relative to the core logic circuitry, said cell including a second input buffer having an input connected to said second I/O pad and an output buffer having an input that is connected to said output of said first input buffer and not connected to an output of the core logic circuitry, and further having an output that is connected to said second I/O pad;

whereby an output feed-through path is provided between said first I/O pad and second I/O pad and bypassing the core logic circuitry to feed a signal on said first I/O pad through to said second I/O pad.

2. A feed-through circuit for an integrated circuit having core logic circuitry, comprising:

a first I/O pad;

an I/O cell for providing an output-only function relative to the core logic, the I/O cell including a first output buffer connected to an output of the core logic circuitry and an output connected to said first I/O pad, and an input buffer having an input that is connected to said first I/O pad and an output that is not connected to the core logic circuitry;

selection means having first and second inputs and an output, said first input being connected to the core logic circuitry and said second input being connected to said output of said input buffer;

a second I/O pad; and a second output buffer having an input connected to said output of said selection means and an output connected to said second I/O pad;

whereby an input-only feed-through signal path is provided between said first I/O pad and said second I/O pad and bypassing the core logic circuitry to feed a signal on said first I/O pad through to said second I/O pad.

* * * * *

UNITED STATES PATENT AND TRADEMARK OFFICE
CERTIFICATE OF CORRECTION

PATENT NO. : 5,677,914
DATED : October 14, 1997
INVENTOR(S) : James L. Fulcomer and Eduardo R. Zayas It is certified that error appears in the above-identified patent and that said Letters Patent is hereby corrected as shown below:

At column 1, line 4, insert the following as the first paragraph after the heading BACKGROUND OF THE INVENTION:

-- This invention was made with Government support under Contract Number F33657-91-C-0006 awarded by the Department of the Air Force. The Government has certain rights in this invention. --

Signed and Sealed this

Thirtieth Day of November, 1999

Attest:

Q. TODD DICKINSON

Attesting Officer

Acting Commissioner of Patents and Trademarks